US009449128B2

(12) United States Patent
Kirsanov et al.

(10) Patent No.: US 9,449,128 B2
(45) Date of Patent: Sep. 20, 2016

(54) AUTOMATIC COMPUTATION OF FUNDAMENTAL FREQUENCIES AND MAXIMUM HARMONIC ORDERS FOR RADIO FREQUENCY SYSTEMS

(71) Applicant: The MathWorks, Inc., Natick, MA (US)

(72) Inventors: Danil Kirsanov, Cambridge, MA (US); Mark Reichelt, Wayland, MA (US)

(73) Assignee: The MathWorks, Inc., Natick, MA (US)

( * ) Notice: Subject to any disclaimer, the term of this patent is extended or adjusted under 35 U.S.C. 154(b) by 490 days.

(21) Appl. No.: 13/689,185

(22) Filed: Nov. 29, 2012

(65) Prior Publication Data

US 2014/0149088 A1 May 29, 2014

(51) Int. Cl.
*G06F 17/50* (2006.01)
*H03F 3/195* (2006.01)

(52) U.S. Cl.
CPC ........... *G06F 17/5036* (2013.01); *H03F 3/195* (2013.01); *H03F 2200/372* (2013.01)

(58) Field of Classification Search
None
See application file for complete search history.

(56) References Cited

U.S. PATENT DOCUMENTS

| | | | |
|---|---|---|---|
| 5,610,847 A * | 3/1997 | Kundert | 702/77 |
| 5,663,890 A * | 9/1997 | Saleh et al. | 703/4 |
| 8,868,364 B2 * | 10/2014 | Antonesei | 702/75 |
| 2003/0181186 A1 * | 9/2003 | Sorrells et al. | 455/296 |
| 2008/0288201 A1 * | 11/2008 | Oettinger et al. | 702/109 |
| 2011/0025296 A1 * | 2/2011 | Benedikt et al. | 324/76.19 |
| 2013/0029619 A1 * | 1/2013 | Zhang et al. | 455/127.2 |
| 2013/0144561 A1 * | 6/2013 | Harb et al. | 702/189 |
| 2014/0002188 A1 * | 1/2014 | Chen et al. | 330/250 |
| 2014/0047407 A1 * | 2/2014 | Danielsson et al. | 717/104 |

OTHER PUBLICATIONS

Hattori et al. Harmonic Balance Simulation of RF Injection Effects in Analog Circuits IEEE Transactions on Electromagnetic Compatibility, vol. 40, No. 2, May 1998.*
"Minimize Computations for RF Simulations—MATLAB & Simulink", www.mathworks.com/help/simrf/gs/minimize-computations-for-rf-simulations.html, Oct. 22, 2012, 7 pages.
Notification of transmittal of the International Search Report and the Written Opinion of the International Searching Authority, or the Declaration corresponding to PCT/US2013/071623 mailed Apr. 8, 2014, 12 pages.

(Continued)

*Primary Examiner* — Omar Fernandez Rivas
*Assistant Examiner* — Cuong Luu
(74) *Attorney, Agent, or Firm* — Harrity & Harrity, LLP

(57) ABSTRACT

A device may receive information that identifies a set of input frequencies and a set of output frequencies associated with a circuit. The device may determine, based on the set of input frequencies and the set of output frequencies, a set of fundamental frequencies associated with the circuit, and a harmonic order corresponding to one or more fundamental frequencies in the set of fundamental frequencies, where the one or more fundamental frequencies and the corresponding harmonic orders are based on a quantity of harmonic frequencies associated with the circuit. The device may output or store the one or more fundamental frequencies and the corresponding harmonic orders.

20 Claims, 11 Drawing Sheets

(56) References Cited

OTHER PUBLICATIONS

Agilent Technologies "Advanced Design System 2011.01—Guide to Harmon Balance Simulation in ADS", http://edownload.soco. agilent.com/eedl/ads/2011_01/pdf/adshbapp.pdf, Jan. 1, 2011, pp. 1-61.

Kenneth S. Kundert, "Introduction to RF Simulation and Its Application", IEEE Journal of Solid-State Circuits, vol. 34, No. 9, Sep. 1, 1999, pp. 1298-1319.

* cited by examiner

AUTOMATIC COMPUTATION OF FUNDAMENTAL FREQUENCIES AND MAXIMUM HARMONIC ORDERS FOR RADIO FREQUENCY SYSTEMS

DETAILED DESCRIPTION

The following detailed description of example implementations refers to the accompanying drawings. The same reference numbers in different drawings may identify the same or similar elements Electronic circuit simulation uses mathematical models to replicate the behavior of an actual electronic device or circuit. The electronic circuit may be driven by one or more signals (e.g., a current, a voltage, a power level, etc.) that change (e.g., oscillate) with a particular frequency. For example, the electronic circuit may be a radio frequency circuit, which may be driven by a signal with a carrier frequency. Signals with a particular set of frequencies may be input to the circuit (e.g., used to drive the circuit), output from the circuit, and/or used to drive one or more elements of the circuit (e.g., a resistor, a capacitor, an amplifier, etc.).

A circuit may be represented and/or simulated using a system of equations (e.g., a system of differential equations), where each circuit element may be represented by an equation. A circuit simulator may solve the system of equations to determine various values (e.g., voltages, currents, power levels, etc.) associated with the circuit and/or circuit elements at a particular time. To set up the system of equations, a user may be required to input a set of fundamental frequencies and harmonic orders that drive the circuit. Users often find that determining the fundamental frequencies and harmonic orders is complicated and/or confusing. Implementations described herein may assist the user in determining the fundamental frequencies and harmonic orders associated with a circuit.

Figure 1:
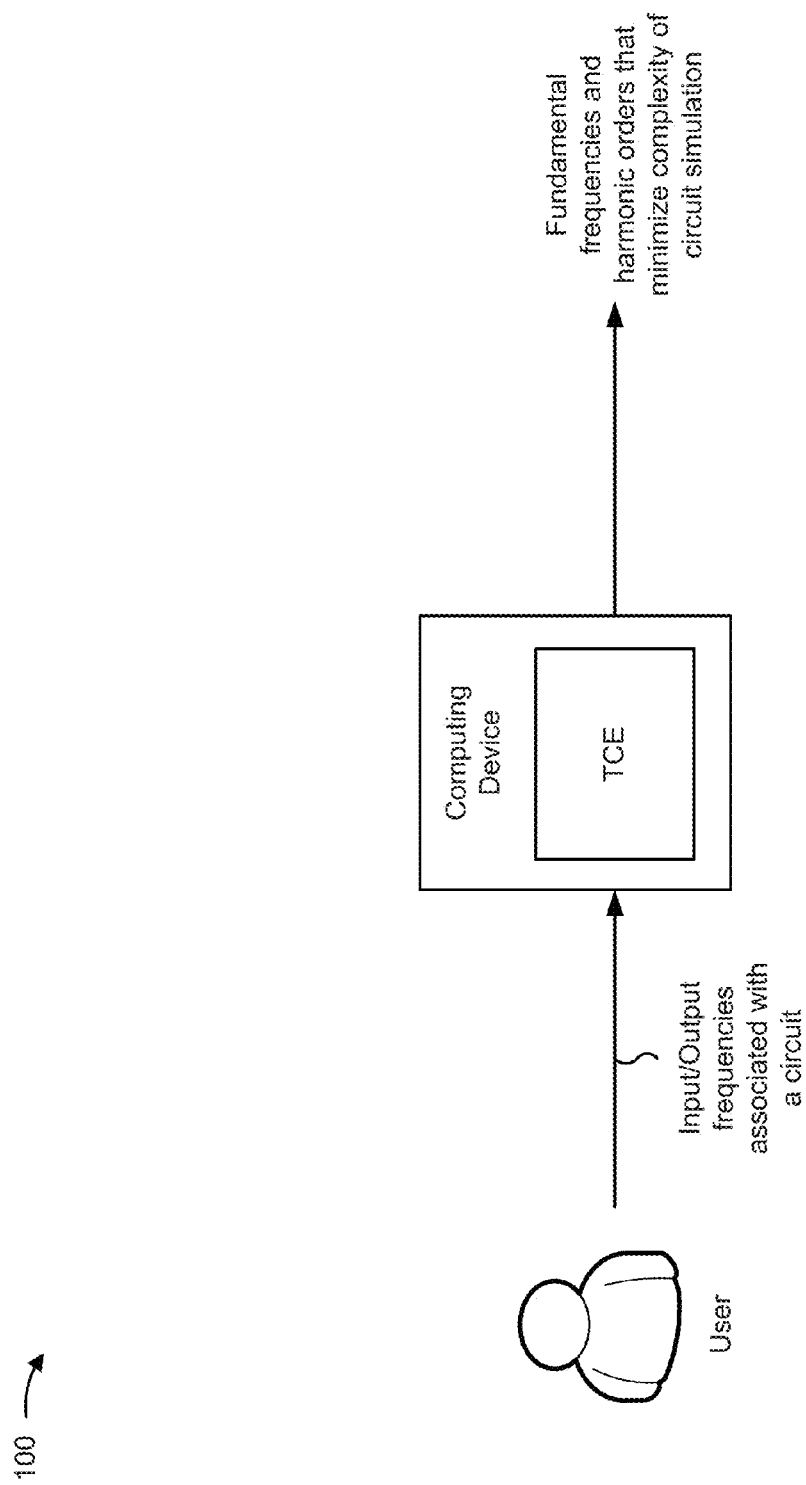
FIG. 1 is a diagram of an overview of an example implementation described herein.

FIG. 1 is a diagram of an overview of an example implementation 100 described herein. As shown in FIG. 1, example implementation 100 may include a computing device, which may host a technical computing environment (TCE), which may include a circuit simulator. The TCE may receive (e.g., from a user) a representation of an electronic circuit. The TCE may also receive (e.g., from the user) a set of frequencies associated with the circuit, such as input frequencies that drive the circuit, and output frequencies produced by the circuit. The TCE may apply one or more algorithms to the set of frequencies to determine fundamental frequencies and harmonic orders associated with the circuit. The fundamental frequencies and harmonic orders may be used in a system of equations that represents the circuit, and may be selected by the TCE so as to minimize the complexity of the system of equations and the circuit simulation.

As used herein, a fundamental frequency may, for example, refer to the lowest frequency of a periodic waveform. A harmonic order may, for example, refer to an integer value that, when multiplied by the fundamental frequency, produces a harmonic frequency. A harmonic frequency may be an integer multiple of the fundamental frequency. For example, if the fundamental frequency (sometimes referred to as the first harmonic, the first order harmonic, or the harmonic of the first order) is 25 Hz, the harmonic frequencies are 50 Hz (the second harmonic), 75 Hz (the third harmonic), etc.

Figure 2:
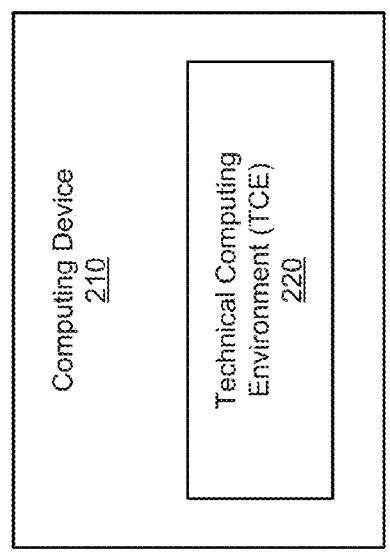
FIG. 2 is a diagram of an example environment in which systems and/or methods described herein may be implemented.
Figure 2:

FIG. 2 is a diagram of an example environment 200 in which systems and/or methods described herein may be implemented. As illustrated, environment 200 may include a computing device 210.

Computing device 210 may include one or more devices generate, compile, and/or execute code. For example, computing device 210 may include a server, a workstation, a mainframe, a computer (e.g., a desktop computer, a laptop computer, a tablet computer, etc.), and/or some other type of computational device.

Computing device 210 may host a TCE 220. TCE 220 may include hardware-based logic or a combination of hardware and software-based logic that provides a computing environment. TCE 220 may permit a user to perform tasks related to a discipline or a domain. For example, TCE 220 may pertain to mathematics, science, engineering, medicine, business, and/or another type of discipline or domain in a manner similar to that described above. In some implementations, TCE 220 may be hosted by another device, such as a server, that is located remotely from computing device 210.

TCE 220 may include a text-based environment (e.g., MATLAB® software), a graphically-based environment (e.g., Simulink® software, Stateflow® software, SimEvents® software, etc., by The MathWorks, Inc.; VisSim by Visual Solutions; LabView® by National Instruments; etc.), or another type of environment, such as a hybrid environment that may include, for example, one or more of the above-referenced text-based environments and one or more of the above-referenced graphically-based environments. Thus, while the description below focuses on a graphically-based environment, systems and/or methods, described herein, are equally applicable to text-based environments and hybrid environments.

TCE 220 may be integrated with or operate in conjunction with a graphical modeling environment, which may provide graphical tools for constructing circuit simulations, systems, or processes. TCE 220 may include additional tools, such as tools designed to convert a circuit simulation into an alternate representation, such as source computer code, compiled computer code, or a hardware description (e.g., a description of a circuit layout). In some implementations, TCE 220 may provide this ability using graphical toolboxes (e.g., toolboxes for signal processing, image processing, color manipulation, data plotting, parallel processing, etc.). In some implementations, TCE 220 may provide these functions as block sets. In some implementations, TCE 220 may provide these functions in another way.

Circuit simulations generated with TCE 220 may be, for example, models of a physical system, a computing system, an electrical system, an engineered system, an embedded system, a biological system, a chemical system, a hybrid system, etc.

A circuit simulation generated with TCE 220 may include, for example, any equations, assignments, constraints, computations, algorithms, and/or process flows. The circuit simulation may be implemented as, for example, time-based block diagrams (e.g., via the Simulink software), discrete-event based diagrams (e.g., via the SimEvents software), dataflow diagrams, state transition diagrams (e.g., via the Stateflow software), software diagrams, a textual array-based and/or dynamically typed language (e.g., via the MATLAB software), a list or tree, and/or another form.

As previously mentioned, an example implementation of TCE 220 may use one or more text-based products, such as a textual modeling environment. For example, a text-based modeling environment may be implemented using additional products such as, but not limited to Octave, Python, Comsol Script, and MATRIXx from National Instruments; Mathematica from Wolfram Research, Inc.; Mathcad from Mathsoft Engineering & Education Inc.; Maple from Maplesoft; Extend from ImagineThat Inc.; Scilab from The French Institution for Research in Computer Science and Control (INRIA); Virtuoso from Cadence; or Modelica or Dymola from Dynasim. In some implementations, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically-typed language that may be used to express problems and/or solutions in mathematical notations. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on entire aggregations of data without having to resort to explicit loops of individual non-array, i.e., scalar operations.

The text-based modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

In some implementations, TCE 220 may be implemented in a graphically-based modeling environment using products such as, but not limited to; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment.

Although FIG. 2 shows example components of environment 200, in some implementations, environment 200 may include additional components, fewer components, or different components than those depicted in FIG. 2.

Figure 3:
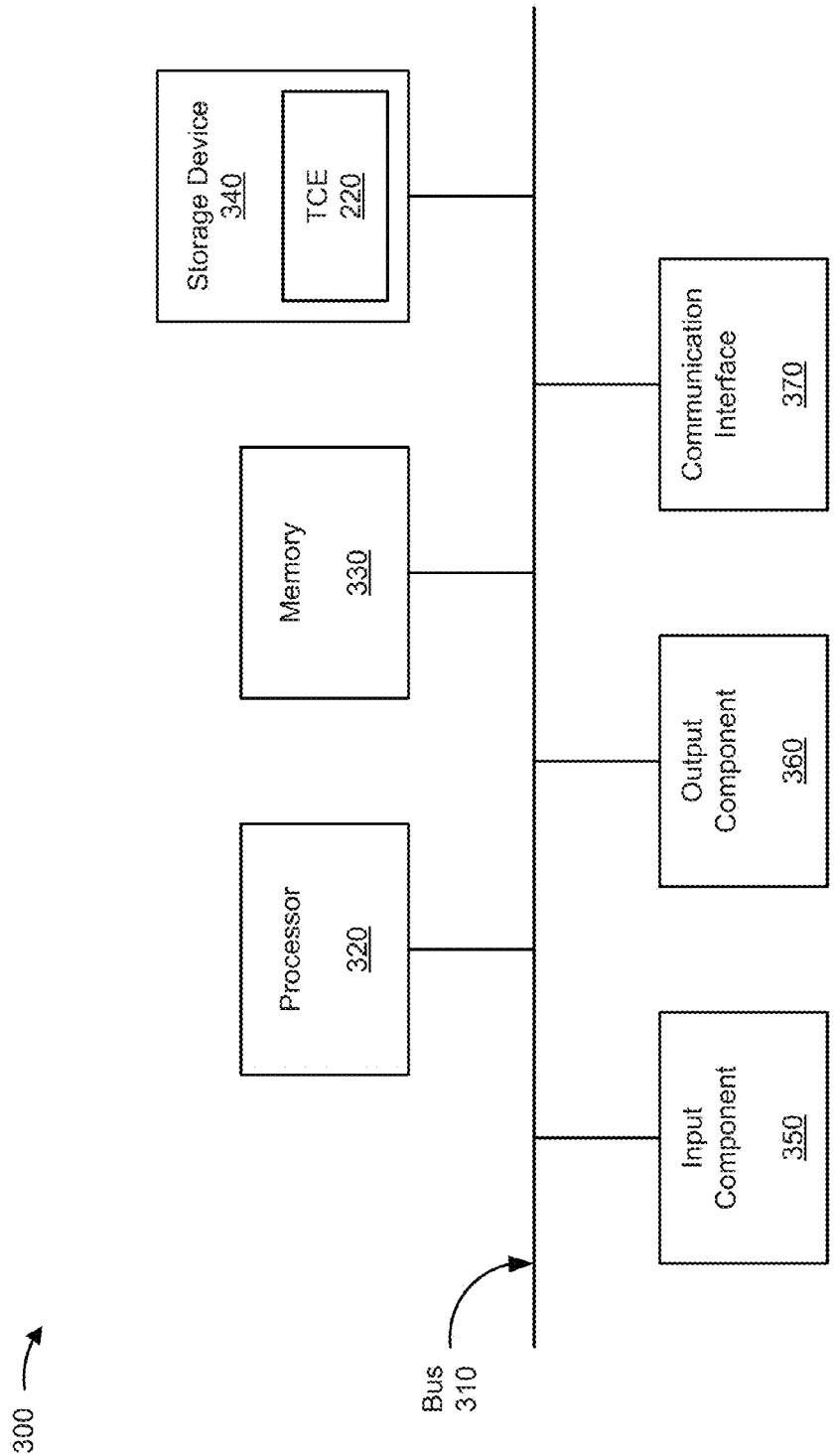
FIG. 3 is a diagram of example components of the computing device shown in FIG. 2.

FIG. 3 is a diagram of example components of a device 300, which may correspond to computing device 210. As illustrated in FIG. 3, device 300 may include a bus 310, a processor 320, a memory 330, a storage device 340, an input component 350, an output component 360, and a communication interface 370.

Bus 310 may permit communication among the other components of device 300. For example, bus 310 may include a system bus, an address bus, a data bus, and/or a control bus. Bus 310 may also include bus drivers, bus arbiters, bus interfaces, and/or bus clocks.

Processor 320 may interpret and/or execute instructions. For example, processor 320 may include a general-purpose processor, a microprocessor, a data processor, a graphical processing unit (GPU), a processing core, an application specific integrated circuit (ASIC), an application specific instruction-set processor (ASIP), a system-on-chip (SOC), a programmable logic device (PLD), a chipset, and/or a field programmable gate array (FPGA).

Memory 330 may store data and/or instructions related to the operation and use of device 300. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage device 340 may store data and/or software related to the operation and use of device 300. For example, storage device 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage device 340 may also include a storage device external to and/or removable from device 300, such as a Universal Serial Bus (USB) memory stick, a hard disk, etc. In some implementations, as illustrated, storage device 340 may store TCE 220.

Input component 350 may permit the user and/or another device to input information into device 300. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit device 300 to output information to the user and/or another device. For example, output component 360 may include a display, a speaker, a light emitting diode (LED), a haptic device, a tactile device, an output port, and/or some other type of output component.

Communication interface 370 may permit device 300 to communicate with other devices, networks, and/or systems. Communication interface 370 may include a transceiver-like component. For example, communication interface 370 may include an Ethernet interface, an optical interface, a coaxial interface, a radio interface, and/or some other type of wireless and/or wired interface.

As will be described in detail below, device 300 may perform certain operations relating to implementations described herein. Device 300 may perform these operations in response to processor 320 executing software instructions (e.g., computer program(s)) contained in a computer-readable medium, such as memory 330 and/or storage device 340. A computer-readable medium may be defined as a non-transitory memory device. A memory device may include space within a single physical memory device or spread across multiple physical memory devices. The software instructions may be read into memory 330 from another computer-readable medium, such as storage device 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 illustrates example components of device 300, in some implementations, device 300 may include additional components, fewer components, different components, or differently arranged components than those illustrated in FIG. 3. Additionally, or alternatively, one or more components of device 300 may perform one or more tasks described as being performed by one or more other components of device 300.

Figure 4A:
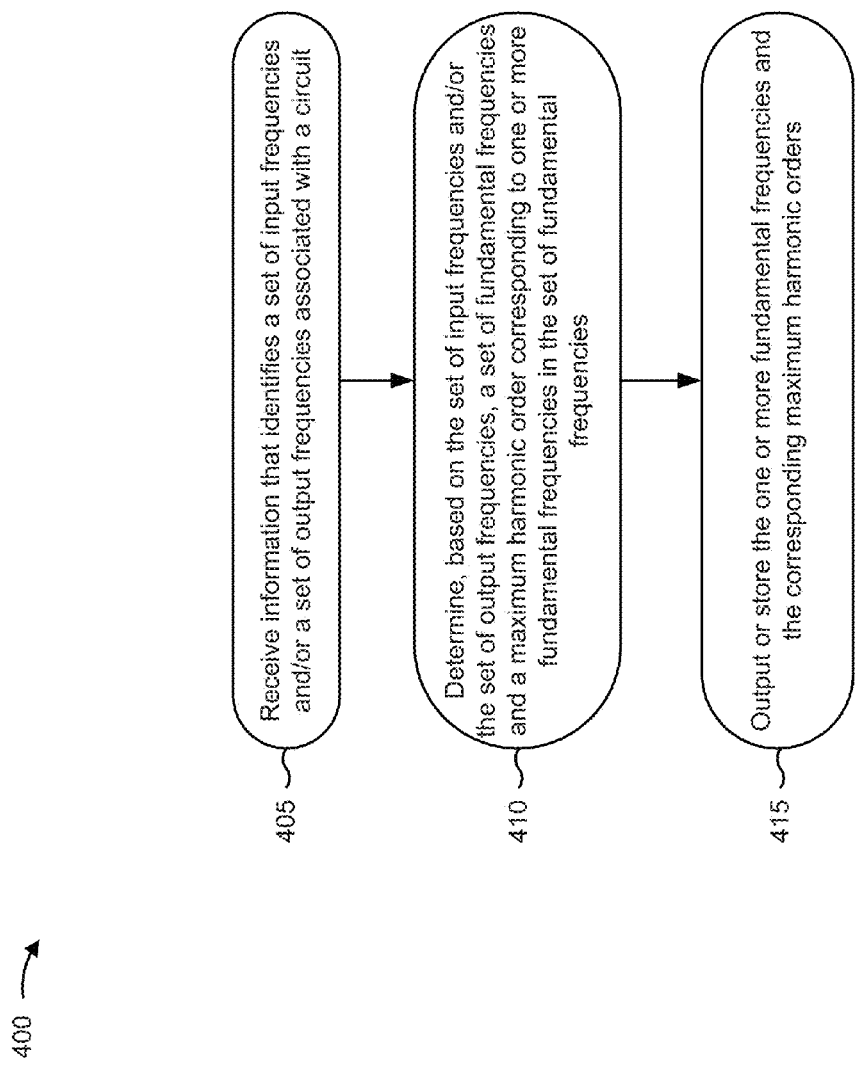
FIGS. 4A-4C are flow charts of an example process for determining fundamental frequencies and harmonic orders associated with a circuit.
Figure 4B:
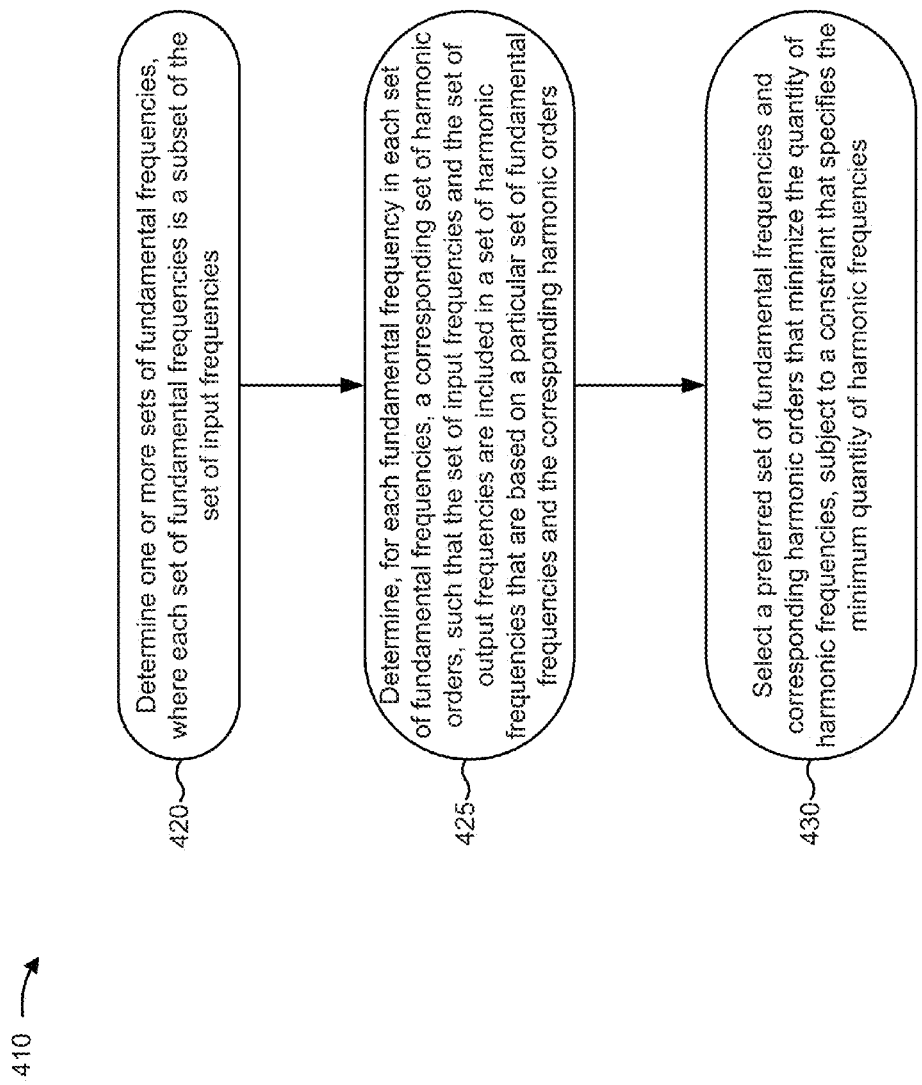
Figure 4C:
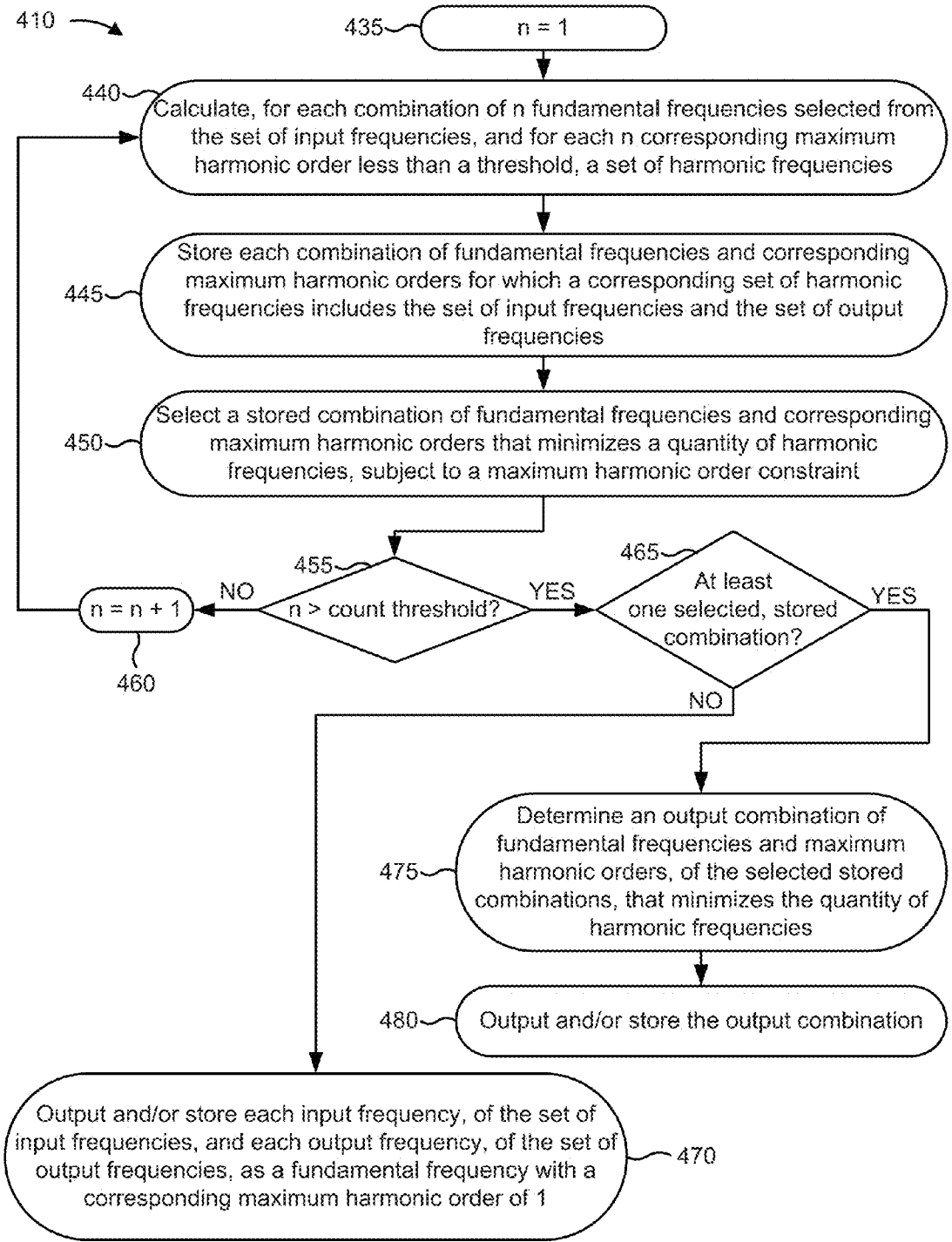

FIGS. 4A-4C are flow charts of an example process 400 for determining fundamental frequencies and harmonic orders associated with a circuit. In some implementations, process 400 may be performed by a device, or a group of devices, separate from, or in combination with, computing device 210.

As shown in FIG. 4A, process 400 may include receiving information that identifies a set of input frequencies and/or a set of output frequencies associated with a circuit (block 405). For example, computing device 210 may receive the information that identifies the frequencies from a user and/or from another device. An input frequency may correspond to a frequency of a signal that is input to a circuit, for example, to drive the circuit. An output frequency may correspond to a frequency of a signal that is produced by or output from the circuit. The signal may include an electrical signal with a current, a voltage, a power level, etc., or another signal that may be used to drive or excite a circuit, or that may be output from a circuit. In some implementations, the input and/or output frequency may change over time, and the received information may identify an input and/or output frequency at a particular point in time (e.g., at a particular time step).

As further shown in FIG. 4A, process 400 may include determining, based on the set of input frequencies and/or the set of output frequencies, a set of fundamental frequencies and a maximum harmonic order corresponding to one or more fundamental frequencies in the set of fundamental frequencies (block 410). In some implementations, computing device 210 may determine a set of fundamental frequencies and a maximum harmonic order corresponding to each fundamental frequency in the set of fundamental frequencies. A fundamental frequency may be the lowest frequency of a periodic waveform. A harmonic order may refer to an integer value that, when multiplied by the fundamental frequency, produces a harmonic frequency. A harmonic frequency may be an integer multiple of the fundamental frequency. For example, if the fundamental frequency (the first harmonic) is 25 Hz, the harmonic frequencies are 50 Hz (the second harmonic), 75 Hz (the third harmonic), etc.

A maximum harmonic order may specify the values of a harmonic order. A maximum harmonic order K may correspond to a harmonic order k, where k is an integer value, and $|k| \leq K$ (e.g., the absolute value of k is less than or equal to K). For example, if the maximum harmonic order K=3, then the corresponding set of harmonic orders k={−3, −2, −1, 0, 1, 2, 3}.

Computing device 210 may combine fundamental frequencies and corresponding harmonic orders (e.g., determined based on a corresponding maximum harmonic order) to generate a set of harmonic frequencies. Each harmonic frequency may be a linear combination of fundamental frequencies and corresponding harmonic orders. For example, for a set of fundamental frequencies $w=\{w_1, w_2, \ldots, w_n\}$ and corresponding maximum harmonic orders $K=\{K_1, K_2, \ldots, K_n\}$, each harmonic frequency may be calculated by:

$$k_1 w_1 + k_2 w_2 + \ldots + k_n w_n$$

where each k is an integer, and $|k_1| \leq K_1$, $|k_2| \leq K_2$, ..., $|k_n| \leq K_n$.

Computing device 210 may select fundamental frequencies and corresponding maximum harmonic orders (and/or harmonic orders) such that the set of all possible harmonic frequencies, calculated as a linear combination of the fundamental frequencies and corresponding maximum harmonic orders, includes the set of input frequencies and the set of output frequencies. For example, assume that the set of input and output frequencies is [1, 2, 3], which may represent 1 hertz (Hz), 2 Hz, and 3 Hz. Computing device 210 may determine a fundamental frequency of 1 Hz and a maximum harmonic order of three (3), which includes the zeroth harmonic, the first harmonic, the second harmonic, and the third harmonic. These harmonic orders can be combined with the fundamental frequency of 1 Hz to calculate the set of input and output frequencies of 1 Hz, 2 Hz, and 3 Hz. For example, the first harmonic of 1 Hz is 1 Hz, the second harmonic of 1 Hz is 2 Hz, and the third harmonic of 1 Hz is 3 Hz.

In some implementations, computing device 210 may determine the set of fundamental frequencies and corresponding maximum harmonic orders that minimizes a complexity of a simulation of the circuit (e.g., that minimizes a quantity of equations in a system of equations that represents the circuit, where each circuit element may be represented by an equation). For example, assume that the set of input and output frequencies is [1, 1000], which may represent 1 Hz and 1000 Hz. Computing device 210 may determine a fundamental frequency of 1 Hz and a maximum harmonic order of 1000. Alternatively, computing device 210 may determine two fundamental frequencies, one at 1 Hz and one at 1000 Hz, and a maximum harmonic order of one (1) for each fundamental frequency. Computing device 210 may determine that the system of equations (e.g., a system of differential equations) that represents the circuit is less complex when using the two fundamental frequencies of 1 Hz and 1000 Hz (each with a maximum harmonic order of one), which includes $(2 \times 1+1) \times (2 \times 1+1)=9$ harmonics, than when using one fundamental frequency of 1 Hz and a maximum harmonic order of one thousand (1000), which includes $2 \times 1000+1=2001$ harmonics.

Computing device 210 may select the fundamental frequencies and corresponding maximum harmonic orders in such a manner as to minimize a quantity of harmonic frequencies calculable from the fundamental frequencies and the corresponding maximum harmonic orders, while ensuring that the calculable harmonic frequencies include the set of input and output frequencies. In some implementations, the minimization may be subject to a constraint that specifies a minimum quantity of harmonic frequencies. In some implementations, the constraint may be based on a quantity of fundamental frequencies. For example, when computing device 210 selects two fundamental frequencies, computing device 210 may minimize a quantity of harmonic frequencies, subject to the quantity of harmonic frequencies for each fundamental frequency being greater than or equal to eleven (e.g., the maximum harmonic order for each fundamental frequency being greater than or equal to 5, because the quantity of harmonic frequencies h is equal to two times the maximum harmonic order K plus one (h=2K+1), or 11=2×5+1). These constraint values are provided as an example, and other constraint values may be used in some implementations.

In some implementations, computing device 210 may use other properties (e.g., other than or in addition to input/output frequencies) of a circuit, such as circuit topology, a maximum non-linearity order of the circuit elements, etc., to determine the fundamental frequencies and/or the corresponding maximum harmonic orders associated with the circuit.

As further shown in FIG. 4A, process 400 may include outputting or storing the one or more fundamental frequencies and the corresponding maximum harmonic orders (block 415). In some implementations, computing device 210 may output or store each fundamental frequency in the set of fundamental frequencies, and the corresponding maximum harmonic orders. For example, computing device 210 may output the fundamental frequencies and maximum harmonic orders to a display (e.g., a user interface, a display of computing device 210, etc.). Additionally, or alternatively, computing device 210 may store the fundamental frequencies and maximum harmonic orders in memory. Computing device 210 may use the fundamental frequencies and maximum harmonic orders (and/or corresponding harmonic frequencies) to set up and solve a system of equations (e.g., differential equations) that represents a circuit. For example, each equation in the system of equations may represent an element of the circuit (e.g., a resistor, a capacitor, an amplifier, a transistor, an inductor, a transformer, a diode, a gate, etc.), and the system of equations may be used (e.g., solved) to calculate a parameter associated with each circuit element (e.g., a voltage, a current, a power level, etc.), at a particular time, for each harmonic frequency. Computing device 210 may receive other information associated with circuit elements (e.g., equations that represent the circuit elements, relationships between circuit elements, etc.), and may set up and solve the system of equations based on the other information.

Process block 410 may include the process blocks depicted in FIG. 4B. As shown in FIG. 4B, process block 410 may include determining one or more sets of fundamental frequencies, where each set of fundamental frequencies is a subset of the set of input frequencies (block 420). For example, computing device 210 may receive the set of input frequencies $f=\{f_1 \ldots f_r\}$, and may receive a set of output frequencies $s=\{s_1 \ldots s_m\}$. Computing device 210 may determine one or more sets of fundamental frequencies $w=\{w_1 \ldots w_n\}$ such that w is a subset of f.

As further shown in FIG. 4B, process block 410 may include determining, for each fundamental frequency in each set of fundamental frequencies, a corresponding set of harmonic orders, such that the set of input frequencies and the set of output frequencies are included in a set of harmonic frequencies that are based on a particular set of fundamental frequencies and the corresponding harmonic orders (block 425). For example, computing device 210 may determine, for each fundamental frequency $\{w_1 \ldots w_n\}$, a maximum harmonic order $K=\{K_1 \ldots K_n\}$ (where n corresponds to the quantity of fundamental frequencies). The set of harmonic orders that corresponds to a fundamental frequency may be represented by k, where k is an integer value, and $|k| \leq K$ (e.g., the absolute value of k is less than or equal to K). For example, if the maximum harmonic K=3, then the corresponding set of harmonic orders $k=\{-3, -2, -1, 0, 1, 2, 3\}$.

Computing device 210 may determine the set of fundamental frequencies $w=\{w_1, w_2, \ldots, w_n\}$ and corresponding maximum harmonic orders $K=\{K_1, K_2, \ldots, K_n\}$ for each fundamental frequency in the set of fundamental frequencies (where $K_n$ corresponds to $w_n$), such that a linear combination of one or more fundamental frequencies and a corresponding harmonic order produces the set of input frequencies f and the set of output frequencies s. For example, computing device 210 may ensure that a linear combination $\{k_1 w_1 + k_2 w_2 + \ldots + k_n w_n\}$ (where each k is an integer, and $|k_1| \leq K_1$, $|k_2| \leq K_2, \ldots, |k_n| \leq K_n$) exists that equals each input frequency $f=\{f_1 \ldots f_r\}$ and each output frequency $s=\{s_1 \ldots s_m\}$.

As further shown in FIG. 4B, process block 410 may include selecting a set of preferred fundamental frequencies and corresponding harmonic orders that minimize the quantity of harmonic frequencies, subject to a constraint that specifies the minimum quantity of harmonic frequencies (block 430). In some implementations, computing device 210 may determine multiple combinations of fundamental frequencies and harmonic orders that can be linearly combined to produce each input frequency f and each output frequency s. Computing device 210 may compare the multiple combinations to select the combination that minimizes the quantity of possible harmonic frequencies. The quantity of harmonic frequencies may depend on the quantity of fundamental frequencies and/or each corresponding quantity of harmonic orders (e.g., each corresponding maximum harmonic order).

In some implementations, computing device 210 may determine the quantity of harmonic frequencies using the following equation:

$$\text{Quantity of harmonic frequencies} = \Pi_{x=1}^{n} 2K_x + 1$$

where n is the quantity of fundamental frequencies and $K_x$ is the maximum harmonic order for the xth fundamental frequency. Computing device 210 may select the set of fundamental frequencies and corresponding harmonic orders that minimizes this equation. In other words, computing device 210 may minimize the following quantity:

$$(2K_1+1) \times (2K_2+1) \times \ldots \times (2K_n+1)$$

where n is the quantity of fundamental frequencies and $K_n$ is the maximum harmonic order for the nth fundamental frequency.

As an example, assume that the set of input frequencies f and output frequencies s is $\{1, 2, 3, 10, 20\}$. Computing device 210 may determine a first combination using, for example, a single fundamental frequency $w=1$, and a maximum harmonic order $K=20$. Computing device 210 may determine a second combination using, for example, two fundamental frequencies $w_1=1$ and $w_2=10$, and corresponding maximum harmonic orders $K_1=3$ and $K_2=2$.

For the first combination of $w=1$ and $K=20$, the total quantity of harmonic frequencies is $(2 \times 20+1)=41$. In other words, there are 41 possible harmonic frequencies, given by the values $\{-20, -19, -18, \ldots, 0, 1, 2, \ldots, 18, 19, 20\}$. For the second combination of $w_1=1$, $w_2=10$, $K_1=3$, and $K_2=2$, the total quantity of harmonic frequencies is $(2\times 3+1)\times(2\times 2+1)=7\times 5=35$. In other words, there are 35 possible harmonic frequencies, given by the linear combination of a first set $\{-3, -2, -1, 0, 1, 2, 3\}$, corresponding to the first fundamental frequency $w_1=1$ and first maximum harmonic order $K_1=3$, and a second set $\{-20, -10, 0, 10, 20\}$, corresponding to the second fundamental frequency $w_2=10$ and second maximum harmonic order $K_2=2$. The first element of the first set $(-3)$ may be combined with each element of the second set $\{-20, -10, 0, 10, 20\}$ to produce five possible harmonic frequencies $\{-23, -13, -3, 7, 17\}$. Elements 2-7 of the first set may be similarly combined with each element of the second set to produce five possible harmonic frequencies for each element of the first set, for a total of 35 possible harmonic frequencies.

In some implementations, when minimizing the quantity of harmonic frequencies, computing device 210 may receive and use a constraint that specifies a minimum quantity of harmonic frequencies. The minimum quantity of harmonic frequencies may be based on the quantity of fundamental frequencies, and may be used by computing device 210 to ensure that the circuit simulation is numerically correct. The constraint may specify that each K satisfy a threshold, one or more elements of the set $\{K, \ldots, K_n\}$ satisfy a threshold, any of the elements of the set $\{K, \ldots, K_n\}$ satisfy a threshold, the sum of one or more elements of the set $\{K, \ldots, K_n\}$ satisfy a threshold, the quantity of harmonic frequencies satisfies a threshold, etc.

For example, when computing device 210 determines a combination using a single fundamental frequency (e.g., n=1), computing device 210 may minimize the quantity of harmonic frequencies subject to a constraint that specifies that $K_1 \geq 7$. When computing device 210 determines a combination using two fundamental frequencies (e.g., n=2), computing device 210 may minimize the quantity of harmonic frequencies, subject to a constraint that specifies, for example, that $K_1 \geq 5$ and/or $K_2 \geq 5$ (and/or $K_1+K_2 \geq 5$). When computing device 210 determines a combination using three fundamental frequencies (e.g., n=3), computing device 210 may minimize the quantity of harmonic frequencies, subject to a constraint that specifies, for example, that $K_1 \geq 3$ and/or $K_2 \geq 3$ and/or $K_3 \geq 3$ (and/or $K_1+K_2+K_3 \geq 3$). The constraint may be a default constraint, and/or may be input by a user and/or a device. These constraint values are provided as an example, and other constraint values may be used in some implementations.

In addition to, or as an alternative to, the process blocks shown in FIG. 4B, process block 410 may include the process blocks depicted in FIG. 4C. As shown in FIG. 4C, process block 410 may include setting a counter n to a value of 1 (e.g., n=1) (block 435). For example, computing device 210 may set a counter n equal to a value of 1. The counter n may represent a quantity of fundamental frequencies to be used by computing device 210 in an iterative process.

Process block 410 may include calculating, for each combination of n fundamental frequencies $\{w_1, \ldots, w_n\}$ selected from the set of input frequencies, and for each n corresponding maximum harmonic order $\{K_1, \ldots, K_n\}$ less than a threshold, a set of harmonic frequencies (block 440). Computing device 210 may select a combination of n fundamental frequencies $\{w_1, \ldots, w_n\}$ that are a subset (or the entire set) of the set of input frequencies. Computing device 210 may also select, for each of the n fundamental frequencies, a corresponding maximum harmonic order $\{K_1, \ldots, K_n\}$. In some implementations, computing device 210 may receive a threshold, and may select the maximum harmonic orders $\{K_1, \ldots, K_n\}$ so that each maximum harmonic order is less than the threshold. The threshold may be based on a quantity of fundamental frequencies (e.g., may be based on the value of n). For example, when n=1, the threshold may be set to 100; when n=2, the threshold may be set to 10; when n=3, the threshold may be set to 8; when n=4, the threshold may be set to 5. These constraint values are provided as an example, and other constraint values may be used in some implementations. The constraint values may ensure that the simulation, the circuit representation, and/or the system of equations is numerically correct.

Based on the selected fundamental frequencies $\{w_1, \ldots, w_n\}$ and the corresponding maximum harmonic orders $\{K_1, \ldots, K_n\}$, computing device 210 may calculate a set of harmonic frequencies. Each harmonic frequency may be a linear combination of the selected fundamental frequencies $\{w_1, \ldots, w_n\}$ and corresponding harmonic orders $\{k_1, \ldots, k_n\}$, and may be calculated by $\{k_1 w_1 + \ldots + k_n w_n\}$, where $k_1, \ldots, k_n$ are integers, and $|k_1| \leq K_1, \ldots, |k_n| \leq K_n$.

Process block 410 may include storing each combination of fundamental frequencies $\{w_1, \ldots, w_n\}$ and corresponding maximum harmonic orders $\{K_1, \ldots, K_n\}$ for which a corresponding set of harmonic frequencies includes the set of input frequencies and the set of output frequencies (block 445). For example, computing device 210 may store fundamental frequencies and corresponding maximum harmonic orders for which the set of input frequencies and the set of output frequencies are included in the set of harmonic frequencies determined based on a linear combination of the fundamental frequencies $\{w_1, \ldots, w_n\}$ and corresponding maximum harmonic orders $\{K_1, \ldots, K_n\}$. In other words, computing device 210 may store each combination of fundamental frequencies and corresponding maximum harmonic orders for which each input frequency and output frequency can be calculated via $\{k_1 w_1 + \ldots + k_n w_n\}$.

Process block 410 may include selecting a stored combination of fundamental frequencies $\{w_1, \ldots, w_n\}$ and corresponding maximum harmonic orders $\{K_1, \ldots, K_n\}$ that minimizes a quantity of harmonic frequencies $(2K_1+1)\times \ldots \times(2K_n+1)$, subject to a maximum harmonic order constraint (block 450). For example, computing device 210 may compare each stored combination of fundamental frequencies $\{w_1, \ldots, w_n\}$ and maximum harmonic orders $\{K_1, \ldots, K_n\}$ for which a corresponding set of harmonic frequencies includes the set of input frequencies and the set of output frequencies. Based on the comparison, computing device 210 may determine a stored combination that minimizes a total quantity of harmonic frequencies $(2K_1+1)\times \ldots \times(2K_n+1)$.

In some implementations, computing device 210 may receive a maximum harmonic order constraint (e.g., from a user and/or another device). The maximum harmonic order constraint may be based on the quantity n of fundamental frequencies, and may include a constraint that specifies a minimum value for each n corresponding maximum harmonic orders and/or a total quantity of harmonic frequencies $(2K_1+1)\times \ldots \times(2K_n+1)$. For example, when n=1, computing device 210 may ensure that $K_1 \geq 7$; when n=2, computing device 210 may ensure that each or either of $\{K_1, K_2\} \geq 5$; when n=3, computing device 210 may ensure that each or any of $\{K_1, K_2, K_3\} \geq 3$. These constraint values are provided as an example, and other constraint values may be used in some implementations. The constraint values may ensure that the simulation, the circuit representation, and/or the system of equations is numerically correct.

Process block 410 may include determining whether the counter n is greater than a count threshold (block 455). For example, computing device 210 may compare the value of n to a count threshold. The count threshold may be a default count threshold and/or may be provided by a user and/or a device. In some implementations, the count threshold may be set to, for example, a value of 4. Additionally, or alternatively, the count threshold may be based on the quantity of input frequencies and/or output frequencies. For example, the count threshold may be equal to the quantity of input frequencies, the quantity of output frequencies, the sum of the quantity of input frequencies and the quantity of output frequencies, etc. If the counter n is not greater than a count threshold (block 455—NO), process block 410 may include incrementing the counter (e.g., n=n+1) (block 460) and returning to process block 440. For example, computing device 210 may increment the counter n by 1, and may iterate through process blocks 440-450, by selecting a stored combination of fundamental frequencies $\{w_1, \ldots, w_n\}$ and maximum harmonic orders $\{K_1, \ldots, K_n\}$, for one or more values of n, that minimizes a total quantity of harmonic frequencies for a particular value of n.

If the counter n is greater than a counter threshold (block 455—YES), process block 410 may include determining whether there is at least one selected stored combination (block 465). In some implementations, computing device 210 may not determine a combination of fundamental frequencies $\{w_1, \ldots, w_n\}$ and maximum harmonic orders $\{K_1, \ldots, K_n\}$ for which a corresponding set of harmonic frequencies includes the set of input frequencies and the set of output frequencies, subject to the maximum harmonic order constraint.

If there is not at least one selected stored combination (block 465—NO), process block 410 may include outputting and/or storing each input frequency, of the set of input frequencies, and each output frequency, of the set of output frequencies, as a fundamental frequency $\{w_1, \ldots, w_n\}$ with a corresponding maximum harmonic order $\{K_1, \ldots, K_n\}$ of one (1) (block 470). For example, when computing device 210 is unable to determine a satisfactory set of fundamental frequencies and corresponding maximum harmonic orders, computing device 210 may output and/or store, as the fundamental frequencies, the set of input and output frequencies. Additionally, computing device 210 may output and/or store a value of one (1) for each maximum harmonic order corresponding to each input frequency and output frequency in the set of input and output frequencies.

If there is at least one selected stored combination (block 465—YES), process block 410 may include determining an output combination of fundamental frequencies $\{w_1, \ldots, w_n\}$ and corresponding maximum harmonic orders $\{K_1, \ldots, K_n\}$, of the selected stored combinations, that minimizes the quantity of harmonic frequencies $(2K_1+1) \times \ldots \times (2K_n+1)$ (block 475), and outputting and/or storing the output combination (block 480). For example, computing device 210 may select a stored combination for multiple values of n, to produce a set of selected stored combinations. Computing device 210 may compare the combinations in the set of selected stored combinations, and may output and/or store the combination of fundamental frequencies $\{w_1, \ldots, w_n\}$ and maximum harmonic orders $\{K_1, \ldots, K_n\}$, for which a corresponding set of harmonic frequencies includes the set of input frequencies and the set of output frequencies, and which minimizes the total quantity of frequency combinations $(2K_1+1) \times \ldots \times (2K_n+1)$, subject to the maximum harmonic order constraint.

While a series of blocks has been described with regard to FIGS. 4A-4C, the blocks and/or the order of the blocks may be modified in some implementations. Additionally, or alternatively, non-dependent blocks may be performed in parallel.

Figure 5A:
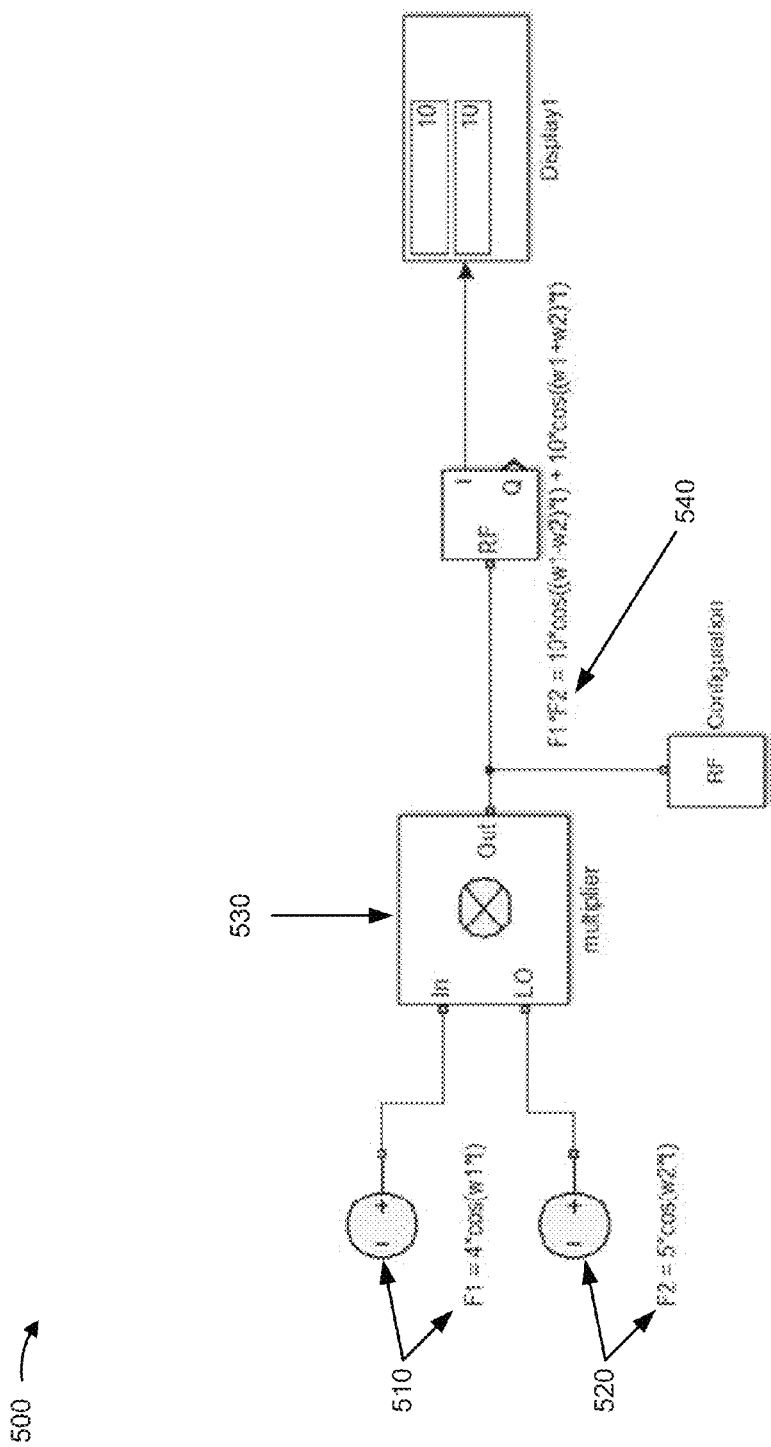
FIGS. 5A, 5B, and 6-8 are diagrams of example implementations relating to the example process shown in FIGS. 4A-4C.
Figure 5B:
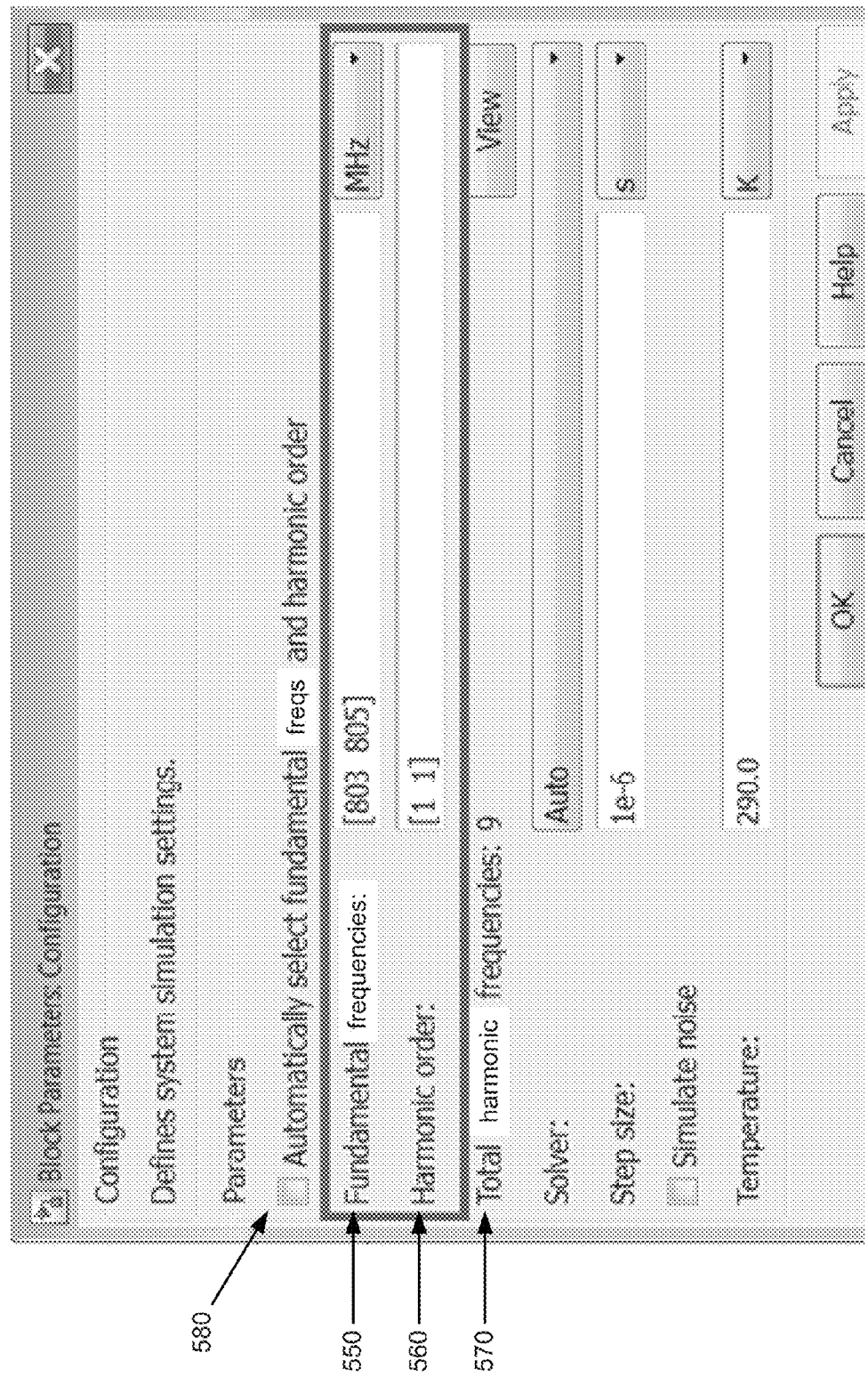

FIGS. 5A and 5B are diagrams of an example implementation 500 relating to process 400 (FIGS. 4A-4C). FIG. 5A depicts an example circuit that may be simulated by computing device 210.

As shown in FIG. 5A, a simulated circuit may receive inputs (e.g., an input voltage), such as first input 510, represented by the equation F1=4 cos($w_1$t), and second input 520, represented by the equation F2=5 cos($w_2$t), where $w_1$ and $w_2$ are input frequencies. The circuit may combine first input 510 and second input 520 using an input multiplier 530, to produce output 540, represented by the equation F1×F2=10 cos(($w_1-w_2$)t)+10 cos(($w_1+w_2$)t). In this example, the input frequencies $w_1$ and $w_2$ have been combined linearly to produce two output frequencies $w_1-w_2$ and $w_1+w_2$.

In example implementation 500, the maximum harmonic orders are $K_1=K_2=1$, and the total quantity of harmonic frequencies is $(2K_1+1) \times (2K_2+1) = 3 \times 3 = 9$. The nine harmonic frequencies are the set $\{w_1-w_2, w_1+0, w_1+w_2, 0-w_2, 0+0, 0+w_2, -w_1-w_2, 0-w_1, w_2-w_1\} = \{w_1-w_2, w_1, w_1+w_2, -w_2, 0, w_2, -w_1-w_2, -w_1, w_2-w_1\}$.

The total quantity of harmonic frequencies may represent the size of a circuit simulation and/or a system of equations that must be solved by computing device 210 in order to calculate a solution for the circuit (e.g., the voltages, currents, etc. at each circuit element at a particular time). A larger sized system of equations may require more time and/or computing resources for computing device 210 to solve than a smaller sized system of equations. Thus, computing device 210 may determine the minimum size of the system of equations (e.g., the minimum quantity of harmonic frequencies).

As shown in FIG. 5B, the user may input, via interface element 550, the fundamental frequencies for the circuit, and may input, via interface element 560, the maximum harmonic order for each fundamental frequency. Assume, as illustrated, that the user inputs fundamental frequencies $\{w_1=803, w_2=805\}$ and maximum harmonic orders $\{K_1=1, K_2=1\}$. Computing device 210 may calculate the total quantity of harmonic frequencies, as shown by reference number 570. In example implementation 500, the total quantity of harmonic frequencies is nine, given by the set $\{w_1-w_2, w_1, w_1+w_2, -w_2, 0, w_2, -w_1-w_2, -w_1, w_2-w_1\} = \{-2, 803, 1608, -805, 0, 805, -1608, -803, 2\}$.

In some implementations, the user may manually input the fundamental frequencies and harmonic orders (e.g., via interface elements 550 and 560). Alternatively, the user may use input element 580 (e.g., a checkbox, a menu item, etc.) to cause computing device 210 to automatically calculate the fundamental frequencies and harmonic orders based on the other user input, such as the input frequencies and/or output frequencies of the circuit. When the user selects input element 580, computing device 210 may automatically calculate and/or output fundamental frequencies and maximum harmonic orders to interface elements 550 and 560, respectively.

Figure 6:
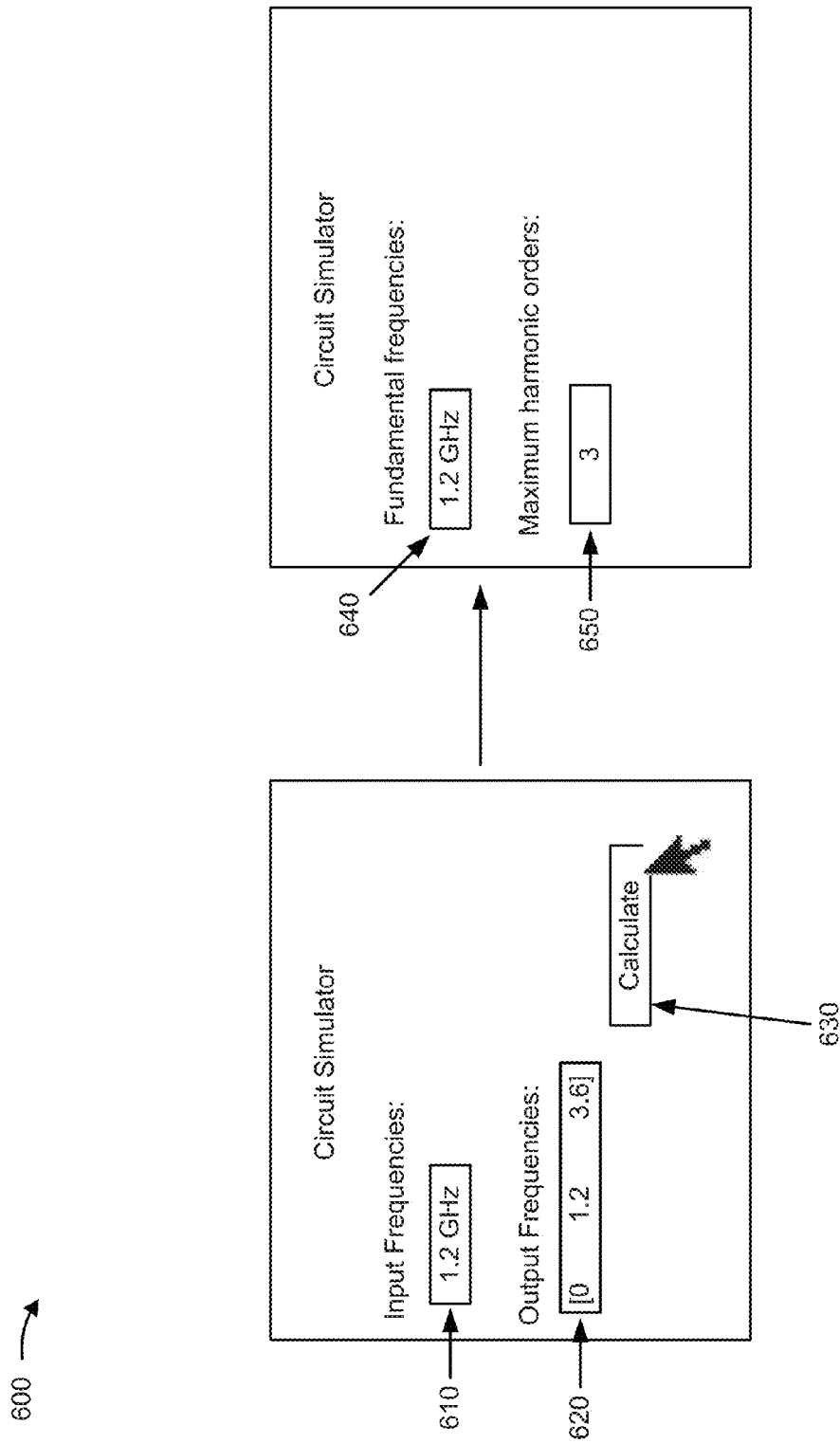

FIG. 6 is a diagram of an example implementation 600 relating to process 400 (FIGS. 4A-4C). FIG. 6 depicts an example of user input that may be used by computing device 210 to determine fundamental frequencies and maximum harmonic orders of a circuit.

As shown in FIG. 6, a user may input, via a user interface of computing device 210, a set of input frequencies and a set of output frequencies. For example, the user may use input element 610 to input one or more input frequencies, and may use input element 620 to input one or more output frequencies. Assume, as illustrated, that the user identifies ones input frequency of 1.2 gigahertz (GHz), and identifies three output frequencies of {0, 1.2, 3.6} GHz. The user may interact with input element 630 (e.g., a button, a menu item, a link, etc.) to cause computing device 210 to calculate the fundamental frequencies and maximum harmonic orders based on the input and output frequencies.

Computing device 210 may be required to use a subset of the input frequencies (e.g., 1.2 GHz) as the fundamental frequencies. Thus, in this example, computing device 210 may be required to use 1.2 GHz as the fundamental frequency.

Computing device 210 may determine the maximum harmonic order of the fundamental frequency 1.2 GHz, based on the requirement that all of the input and output frequencies be included in the set of harmonic frequencies determined based on the fundamental frequency and maximum harmonic order. Each harmonic frequency in the set may take a value of $\{k_1w_1+k_2w_2+ \ldots +k_nw_n\}$ (where $|k_1|\le K_1, |k_2|\le K_2, \ldots, |k_n|\le K_n$), or in this example $\{k_1 \times 1.2\}$, where $|k_1|\le K_1$. In example implementation 600, computing device 210 may determine that the output frequencies {0, 1.2, 3.6} can be calculated using $\{k_1 \times 1.2\}$, where $|k_1|\le 3$, and may determine a maximum harmonic order of $K_1=3$. For example, when $k_1=0$, then $k_1 \times 1.2=0$. When $k_1=1$, then $k_1 \times 1.2=1.2$. When $k_1=3$, then $k_1 \times 1.2=3.6$. Note that $w_1=1.2$ and $K_1=3$ is also a solution for the output frequencies of {0, 1.2, 2.4, 3.6} because when $k_1=2$, then $k_1 \times 1.2=2.4$.

As shown in FIG. 6, computing device 210 may output the solution for the fundamental frequencies and the maximum harmonic orders to a user interface, as shown by reference numbers 640 and 650, respectively.

Figure 7:
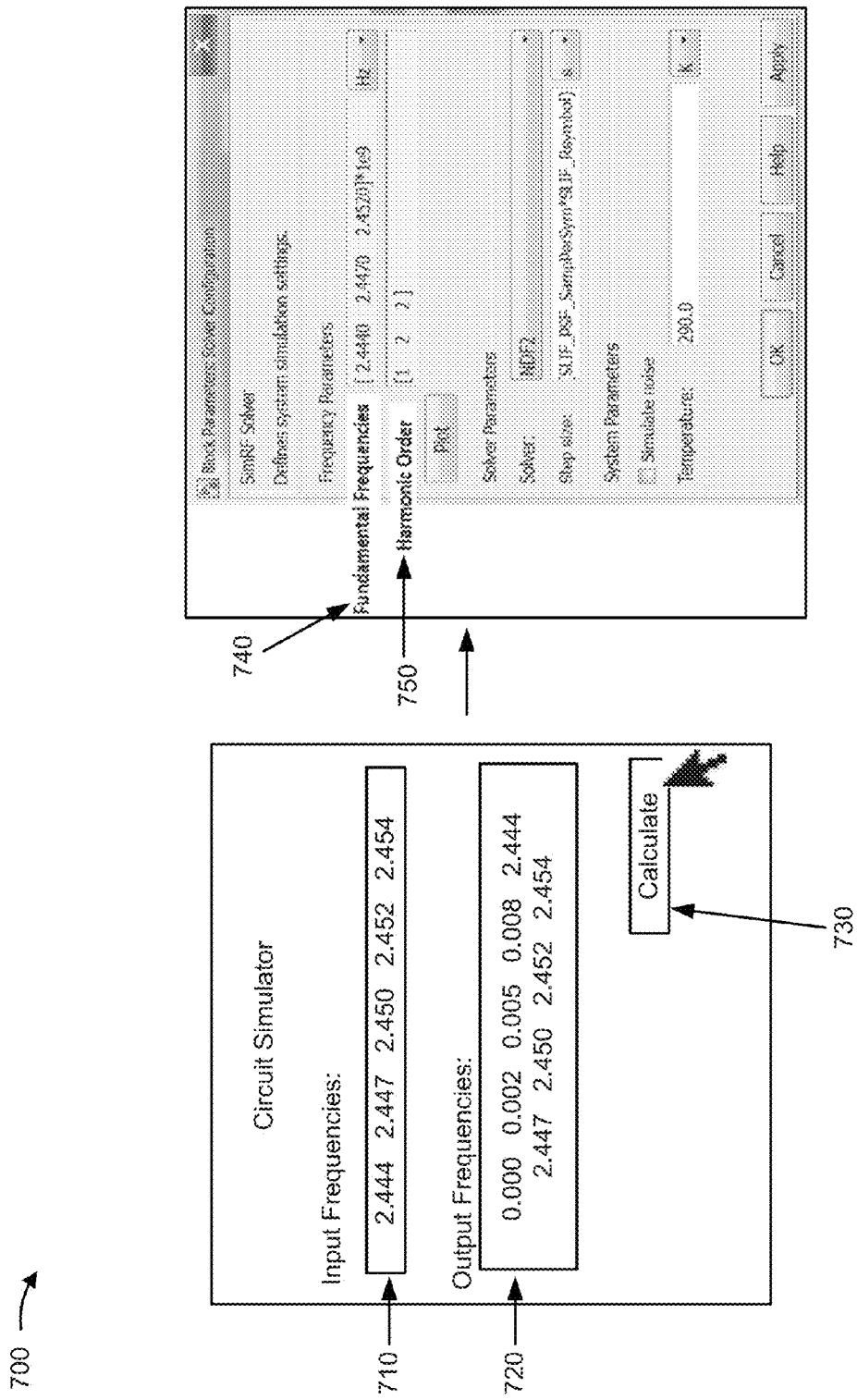

FIG. 7 is a diagram of an example implementation 700 relating to process 400 (FIGS. 4A-4C). FIG. 7 depicts another example of user input that may be used by computing device 210 to determine fundamental frequencies and maximum harmonic orders of a circuit.

As shown in FIG. 7, a user may input, via a user interface of computing device 210, a set of input frequencies and a set of output frequencies. For example, the user may use input element 710 to input one or more input frequencies, and may use input element 720 to input one or more output frequencies. Assume, as illustrated, that the user identifies a set of input frequencies of {2.444, 2.447, 2.450, 2.452, 2.454} GHz, and a set of output frequencies of {0.000, 0.002, 0.005, 0.008, 2.444, 2.447, 2.450, 2.452, 2.454} GHz. The user may interact with input element 730 in order to cause computing device 210 to calculate the fundamental frequencies and maximum harmonic orders based on the input and output frequencies.

Computing device 210 may be required to use a subset of the input frequencies {2.444, 2.447, 2.450, 2.452, 2.454} as the fundamental frequencies, and may minimize a quantity of frequency combinations $(2K_1+1) \times (2K_2+1) \times \ldots \times (2K_n+1)$ given the constraint that all of the input frequencies and output frequencies be a linear combination of $\{k_1w_1+k_2w_2+ \ldots +k_nw_n\}$, where $|k_1|\le K_1, |k_2|\le K_2, \ldots, |k_1|\le K_n$. As shown by reference numbers 740 and 750, computing device 210 may determine that the fundamental frequencies $\{w_1=2.444, w_2=2.447, w_3=2.452\}$ and the maximum harmonic orders $\{K_1=1, K_2=2, K_3=2\}$ minimizes the quantity of frequency combinations while satisfying the linear combination constraint. The linear combination constraint can be shown to be satisfied by the following table:

| $k_1$ | $k_2$ | $k_3$ | Equation | Input/Output Frequency |
|---|---|---|---|---|
| 0 | 0 | 0 | 0 × 2.444 + 0 × 2.447 + 0 × 2.452 = | 0.000 |
| 1 | −2 | 1 | 1 × 2.444 + −2 × 2.447 + 1 × 2.452 = | 0.002 |
| 0 | −1 | 1 | 0 × 2.444 + −1 × 2.447 + 1 × 2.452 = | 0.005 |
| −1 | 0 | 1 | −1 × 2.444 + 0 × 2.447 + 1 × 2.452 = | 0.008 |
| 1 | 0 | 0 | 1 × 2.444 + 0 × 2.447 + 0 × 2.452 = | 2.444 |
| 0 | 1 | 0 | 0 × 2.444 + 1 × 2.447 + 0 × 2.452 = | 2.447 |
| −1 | 2 | 0 | −1 × 2.444 + 2 × 2.447 + 0 × 2.452 = | 2.450 |
| 0 | 0 | 1 | 0 × 2.444 + 0 × 2.447 + 1 × 2.452 = | 2.452 |
| 1 | −2 | 2 | 1 × 2.444 + −2 × 2.447 + 2 × 2.452 = | 2.454 |

Figure 8:
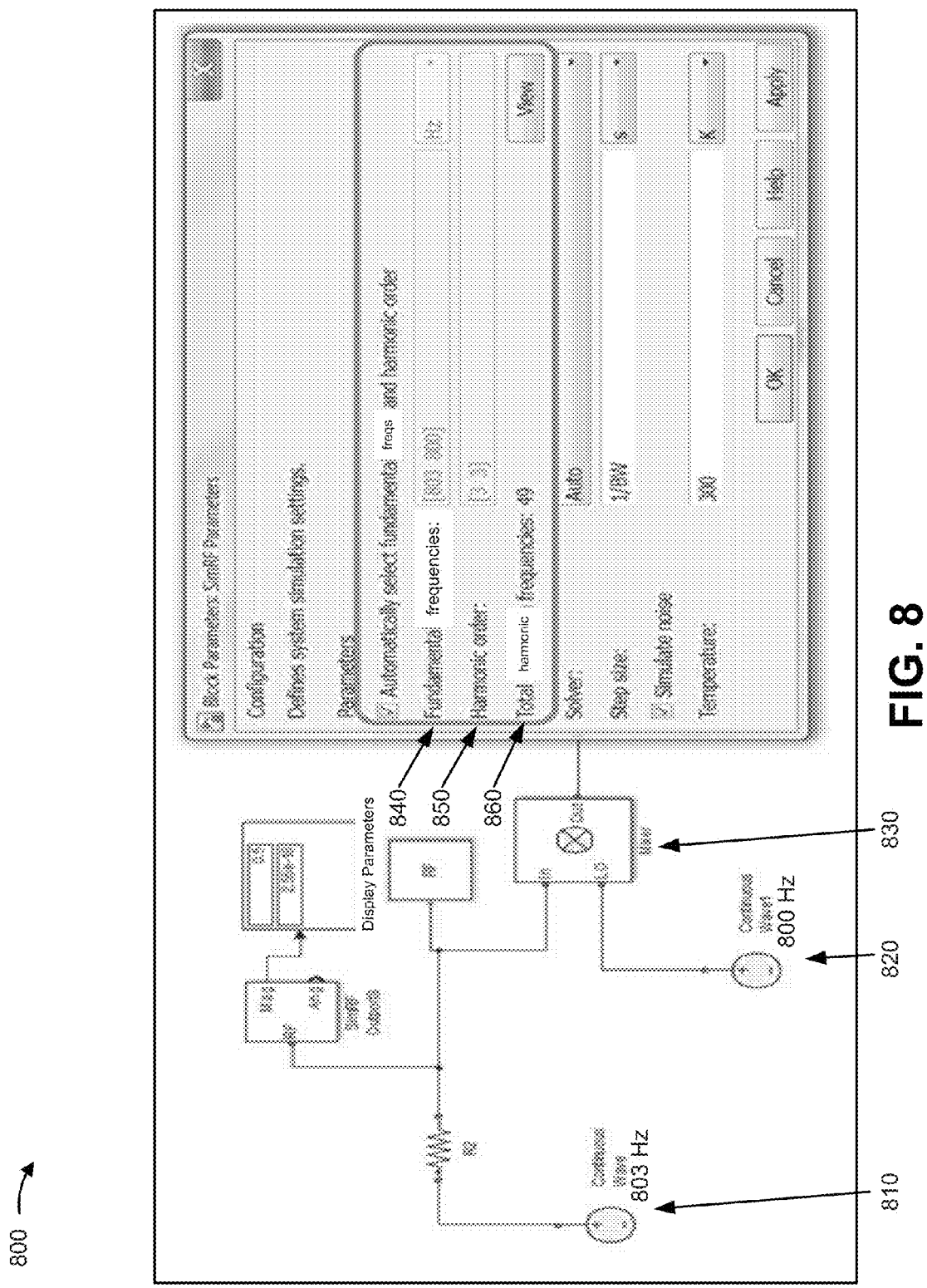

FIG. 8 is a diagram of an example implementation 800 relating to process 400 (FIGS. 4A-4C). FIG. 8 depicts a user interface that may be displayed by computing device 210 to output fundamental frequencies and maximum harmonic orders of a circuit simulation.

As shown in FIG. 8, computing device 210 may display a user interface that depicts circuit elements, including input element 810, input element 820, and combiner element 830. As illustrated, input element 810 may be associated with an input frequency of 803 Hz, and input element 820 may be associated with an input frequency of 800 Hz. Computing device 210 may receive additional input and/or output frequencies (not shown), and may calculate fundamental frequencies and maximum harmonic orders based on the input and/or output frequencies. Computing device 210 may output and/or display, on the user interface, the calculated fundamental frequencies (as shown by reference number 840) and the calculated maximum harmonic orders (as shown by reference number 850).

Additionally, or alternatively, computing device 210 may calculate a total quantity of harmonic frequencies (e.g., a size of a system of equations) based on the calculated fundamental frequencies and the calculated maximum harmonic orders. Computing device 210 may output and/or display, on the user interface, the calculated quantity of harmonic frequencies, as shown by reference number 860. Additionally, or alternatively, computing device 210 may store the calculated fundamental frequencies, harmonic orders, maximum harmonic orders, and/or quantity of harmonic frequencies.

Implementations described herein may assist the user in determining the fundamental frequencies and maximum harmonic orders (and/or harmonic orders) associated with a circuit. Some implementations may minimize a complexity of a circuit simulation by minimizing the size of a system of equations that includes the fundamental frequencies and harmonic orders, and that represents a circuit.

The foregoing disclosure provides illustration and description, but is not intended to be exhaustive or to limit the embodiments to the precise form disclosed. Modifications and variations are possible in light of the above disclosure or may be acquired from practice of the embodiments. While certain portions of the description herein focused on mapping and/or plotting techniques, the techniques described herein are equally applicable to other operations.

Certain implementations have been described herein with respect to maximum harmonic orders. Any implementation described with respect to maximum harmonic orders may alternatively be implemented with respect to harmonic orders, given that harmonic orders k may be determined based on a maximum harmonic order K and a relationship of $|k|\le K$, where k is an integer. Likewise, any implementation described herein with respect to harmonic orders may alternatively be implemented with respect to maximum harmonic orders.

As used herein, the term "component" is intended to be broadly construed as hardware, firmware, or a combination of hardware and software.

It will be apparent that systems and/or methods, as described herein, may be implemented in many different forms of software, firmware, and hardware in the implementations illustrated in the figures. The actual software code or specialized control hardware used to implement these systems and/or methods is not limiting of the implementations. Thus, the operation and behavior of the systems and/or methods were described without reference to the specific software code—it being understood that software and control hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise. As used herein, a "set" may include one or more elements. For example, a set of input frequencies may include one or more input frequencies.

What is claimed is:

1. A device, comprising:
   one or more processors to:
   receive, via a first input element of a graphical user interface, information that identifies a set of input frequencies;
   receive, via a second input element of the graphical user interface, information that identifies a set of output frequencies associated with a circuit;
   calculate, using the set of input frequencies and the set of output frequencies, a set of fundamental frequencies associated with the circuit and one or more harmonic orders that minimize a quantity of equations in a system of equations that represent the circuit,
   the one or more harmonic orders corresponding to one or more fundamental frequencies in the set of fundamental frequencies,
   the one or more fundamental frequencies and the one or more harmonic orders being based on a quantity of harmonic frequencies associated with the circuit; and
   output or store the one or more fundamental frequencies and the one or more harmonic orders,
   the one or more fundamental frequencies and the one or more harmonic orders being output via the graphical user interface.

2. The device of claim 1, where the one or more fundamental frequencies includes each fundamental frequency in the set of fundamental frequencies.

3. The device of claim 1, where the one or more processors are to determine the one or more fundamental frequencies and the one or more harmonic orders based on a circuit topology of the circuit.

4. The device of claim 1, where the one or more fundamental frequencies is a subset of the set of input frequencies.

5. The device of claim 1, where the set of input frequencies and the set of output frequencies are included in a set of harmonic frequencies calculated based on the one or more fundamental frequencies and the one or more harmonic orders.

6. The device of claim 5, where each harmonic frequency, in the set of harmonic frequencies, is a linear combination of the one or more fundamental frequencies and the one or more harmonic orders.

7. The device of claim 1, where the one or more processors are further to:
   receive a constraint that specifies a minimum quantity of harmonic frequencies or a minimum value for each harmonic order of the one or more harmonic orders; and
   determine the one or more fundamental frequencies and the one or more harmonic orders based on the constraint.

8. The device of claim 1, where the one or more processors are further to:
   determine the quantity of equations, representing elements of the circuit, based on the one or more fundamental frequencies and the one or more harmonic orders; and
   solve the quantity of equations.

9. A non-transitory computer-readable medium storing instructions, the instructions comprising:
   one or more instructions that, when executed by a processor, cause the processor to:
   receive, via a first input element of a graphical user interface, information that identifies a set of input frequencies;
   receive, via a second input element of the graphical user interface, information that identifies a set of output frequencies associated with a circuit;
   determine, based on the set of input frequencies and the set of output frequencies, a set of fundamental frequencies associated with the circuit and one or more harmonic orders that minimize a quantity of equations in a system of equations that represent the circuit,
   the one or more harmonic orders corresponding to one or more fundamental frequencies in the set of fundamental frequencies,
   the one or more fundamental frequencies and the one or more harmonic orders being based on a quantity of harmonic frequencies associated with the circuit; and
   the one or more instructions to determine the set of fundamental frequencies and the one or more harmonic orders including:
   one or more instructions to select the set of fundamental frequencies and the one or more harmonic orders such that a set of harmonic frequencies, of the quantity of harmonic frequencies, includes the set of input frequencies and the set of output frequencies; and
   output or store the one or more fundamental frequencies and the one or more harmonic orders.

10. The non-transitory computer-readable medium of claim 9, where the one or more instructions further cause the processor to:
   one or more instructions to determine the one or more fundamental frequencies and the one or more harmonic orders based on at least one of a circuit topology of the circuit and a maximum non-linearity order of circuit elements of the circuit.

11. The non-transitory computer-readable medium of claim 9, where the one or more fundamental frequencies is a subset of the set of input frequencies.

12. The non-transitory computer-readable medium of claim 9, where the set of harmonic frequencies is calculated based on the one or more fundamental frequencies and the one or more harmonic orders.

13. The non-transitory computer-readable medium of claim 12, where each harmonic frequency in the set of harmonic frequencies is a linear combination of the one or more fundamental frequencies and the one or more harmonic orders.

14. The non-transitory computer-readable medium of claim 9, where the one or more instructions further cause the processor to:
receive a constraint that specifies a minimum quantity of harmonic frequencies or a minimum value for each harmonic order of the one or more harmonic orders; and
determine the one or more fundamental frequencies and the one or more harmonic orders based on the constraint.

15. The non-transitory computer-readable medium of claim 9, where the one or more instructions further cause the processor to:
determine the quantity of equations, representing elements of the circuit, based on the one or more fundamental frequencies and the one or more harmonic orders; and
solve the quantity of equations.

16. A method, comprising:
receiving, via an element of a graphical user interface, information that identifies a set of input frequencies and a set of output frequencies associated with a circuit,
the receiving being performed by a device comprising one or more processors;
calculating, based on the set of input frequencies and the set of output frequencies, a set of fundamental frequencies associated with the circuit and harmonic orders that minimize a quantity of equations in a system of equations that represent the circuit,
each harmonic order, of the harmonic orders, corresponding to a respective fundamental frequency in the set of fundamental frequencies,
the set of fundamental frequencies and the harmonic orders being based on a quantity of harmonic frequencies associated with the circuit,
the calculating being performed by the device; and
outputting or storing the set of fundamental frequencies and the harmonic orders, the set of fundamental frequencies and the harmonic orders being output via the graphical user interface,
the outputting or storing being performed by the device.

17. The method of claim 16, where determining the set of fundamental frequencies associated with the circuit and the harmonic orders includes determining the set of fundamental frequencies and the harmonic orders to minimize a quantity of harmonic frequencies associated with the circuit, and
where determining the set of fundamental frequencies and the harmonic orders to minimize the quantity of harmonic frequencies includes selecting a plurality of fundamental frequencies based on a quantity of harmonic frequencies, for each of the plurality of fundamental frequencies, that exceeds a threshold.

18. The method of claim 16, where the set of fundamental frequencies is a subset of the set of input frequencies.

19. The method of claim 16, where the set of input frequencies and the set of output frequencies are included in a set of harmonic frequencies calculated based on the set of fundamental frequencies and the harmonic orders; and
where each harmonic frequency, in the set of harmonic frequencies, is a linear combination of one or more fundamental frequencies in the set of fundamental frequencies, and the harmonic orders.

20. The method of claim 16, further comprising:
determining the quantity of equations, representing elements of the circuit, based on the set of fundamental frequencies and the harmonic orders; and
solving the quantity of equations.

* * * * *